US008289716B2

(12) United States Patent
Patel et al.

(10) Patent No.: US 8,289,716 B2
(45) Date of Patent: Oct. 16, 2012

(54) DUAL LOAD CONTROL DEVICE

(75) Inventors: Parimal R. Patel, Little Neck, NY (US); Danny F. Estanislao, Little Neck, NY (US)

(73) Assignee: Leviton Manufacturing Company, Inc., Little Neck, NY (US)

( * ) Notice: Subject to any disclaimer, the term of this patent is extended or adjusted under 35 U.S.C. 154(b) by 517 days.

(21) Appl. No.: 12/482,316

(22) Filed: Jun. 10, 2009

(65) Prior Publication Data

US 2010/0314226 A1 Dec. 16, 2010

(51) Int. Cl.
*H05K 7/00* (2006.01)

(52) U.S. Cl. ......................... 361/728; 361/730; 361/807

(58) Field of Classification Search .................. 361/752, 361/796, 800–803, 807, 810, 728–730; 313/306, 313/308–310, 326, 331, 336, 351; 445/1, 445/23, 24, 46, 49, 50; 315/194; 219/69.11, 219/69.13, 69.17, 50, 68

See application file for complete search history.

(56) References Cited

U.S. PATENT DOCUMENTS 4,334,171 A 6/1982 Parman et al.
4,672,229 A 6/1987 Skarman et al.
4,924,151 A 5/1990 D'Aleo et al.
5,036,168 A 7/1991 Kikuchi et al.
5,059,871 A 10/1991 Pearlman et al.
5,101,141 A 3/1992 Warner et al.
5,191,265 A 3/1993 D'Aleo et al.
5,248,919 A 9/1993 Hanna et al.
5,336,859 A 8/1994 Wojtanek et al.
5,430,356 A 7/1995 Ference et al.
5,530,322 A 6/1996 Ference et al.
5,736,965 A 4/1998 Mosebrook et al.
5,748,466 A 5/1998 McGivern et al.
5,867,127 A 2/1999 Black et al.
5,982,103 A 11/1999 Mosebrook et al.
6,046,550 A 4/2000 Ference et al.
6,297,724 B1 10/2001 Bryans et al.
6,335,500 B1 1/2002 Chi et al.
6,347,028 B1 2/2002 Hausman, Jr. et al.
6,369,524 B1 4/2002 Sid
6,444,906 B1 * 9/2002 Lewis ............................ 174/53
6,528,957 B1 3/2003 Luchaco
6,761,470 B2 7/2004 Sid
D518,793 S 4/2006 Hedderich et al.
D519,939 S 5/2006 Hedderich et al.
7,071,634 B2 7/2006 Johnson et al.
7,106,261 B2 9/2006 Nagel et al.
(Continued)

FOREIGN PATENT DOCUMENTS

WO WO2008060743 5/2008
(Continued)

*Primary Examiner* — Hung S Bui
(74) *Attorney, Agent, or Firm* — Scully, Scott, Murphy & Presser, P.C.

(57) ABSTRACT

An electrical control device comprising a housing configured to be at least partially mountable within a single-gang electrical box; and including at least first and second switches disposed at least partially within the housing, each the at least first and second switches configured as providing a respective first and second input to the electrical control device and, the electrical control device being configured to be wired to a respective first and a second electrical load. A communications device disposed at least partially within the housing is configured to wirelessly transmit a control signal to control at least one additional electrical load.

18 Claims, 8 Drawing Sheets

U.S. PATENT DOCUMENTS

| | | | | |
|---|---|---|---|---|
| 7,166,970 | B2 | 1/2007 | Johnson et al. | |
| 7,170,018 | B2 | 1/2007 | Ilkhanov | |
| 7,274,117 | B1 * | 9/2007 | Viola et al. | 307/112 |
| D563,326 | S | 3/2008 | Patel et al. | |
| 7,399,205 | B2 * | 7/2008 | McNeely et al. | 439/577 |
| 7,432,463 | B2 * | 10/2008 | Clegg et al. | 200/310 |
| 7,538,285 | B2 | 5/2009 | Patel et al. | |
| 7,837,344 | B2 * | 11/2010 | Altonen et al. | 362/85 |
| 7,928,917 | B1 * | 4/2011 | Feldstein et al. | 343/702 |
| 2002/0139655 | A1 | 10/2002 | Balbon et al. | |
| 2005/0280598 | A1 | 12/2005 | Webb et al. | |
| 2006/0049935 | A1 | 3/2006 | Giannopoulos et al. | |
| 2007/0162536 | A1 | 7/2007 | Ostrovsky et al. | |
| 2008/0237010 | A1 | 10/2008 | Patel et al. | |
| 2009/0102677 | A1 | 4/2009 | Patel et al. | |
| 2009/0150356 | A1 | 6/2009 | Walker | |
| 2009/0260966 | A1 | 10/2009 | Patel et al. | |

FOREIGN PATENT DOCUMENTS

| | | |
|---|---|---|
| WO | WO2008060744 | 5/2008 |
| WO | WO2008060657 | 3/2010 |

* cited by examiner

DUAL LOAD CONTROL DEVICE

CROSS-REFERENCE TO RELATED APPLICATIONS

The present invention relates to commonly-owned, co-pending U.S. patent application Ser. No. 11/694,917 [U.S. Patent Pub. No. 2008/0237010] the entire contents and disclosure of which is incorporated by reference as if fully set forth herein.

BACKGROUND

Wall-mounted electrical switch devices that provide direct control of electrical loads have been known for decades. Emerging electrical switch device technologies now provide for the ability to communicate with a remote control device for providing remote control of electrical devices in home and business automation networks, typically via wireless (e.g., RF) signals.

It would be highly desirable to provide an electrical control device designed to enable both direct control of at least one electrical load (e.g., an electrical device plugged in an individual electrical outlet) via wired connection, in addition to enabling remote control of an electrical load via wireless RF signaling.

Further it would be highly desirable to provide a dual load switching device that provides two switches in a single remote control electrical device box that are independently actuable to directly control two local loads, i.e., by direct connection to each respective switch, while further, being configured for generating and transmitting wireless (RF) messages for wireless controlling a plurality of electrical devices.

Moreover, it would be highly desirable to provide an electrical control device that enables electrical device load control via both direct (wired) and remote (wireless) connections that provides at least one wide area push buttons supported by novel metal leaf springs for biasing the wide area button in order to provide a uniform tactile feeling no matter which part of the button is pressed.

SUMMARY

There is provided an apparatus and method of use for an electrical switch and load control device assembled in a housing; and, more particularly, a dual electrical load control device in communication with circuitry for providing control of local electrical device loads via direct wired connection (e.g., an electrical device plugged in an individual electrical outlet) and control of remote electrical loads via wireless communication.

In one embodiment, there is provided an electrical control device comprising a housing configured to be at least partially mountable within a single-gang electrical box. Additionally, there is provided at least first and second switches disposed at least partially within the housing, each of the at least first and second switches each configured as providing a respective first and second input to the electrical control device, the electrical control device being configured to be wired to a respective first and a second electrical load. A communications device disposed at least partially within the housing is further provided and configured to wirelessly transmit a control signal to control at least one additional electrical load.

There is further provided, a method for controlling a plurality of electrical loads using a single-gang electrical load control device. The method includes opening or closing a first switch or a second switch, each of which is configured to be an input to the electrical load control device, the electrical load control device being wired to at least a first and second respective electrical load, the first or second switch being opened or closed via respective first or second buttons provided on the device; and, utilizing the first or second button on the device to further wirelessly control at least one additional electrical load.

In yet a further embodiment, there is provided a button frame assembly for an electrical control device disposed in a housing and configured to be at least partially mountable within a single-gang electrical box. The electrical control device including circuitry including at least one switch for controlling a respective electrical load via a wired connection thereto. The button frame assembly includes a frame base structure adapted to engage a platform attached to the housing of the electrical control device, the frame base structure including at least one button. At least one leaf spring is provided that is mounted to the frame base structure, the at least one leaf spring associated with the at least one button to bias the associated button in a first direction, the button having an actuating structure formed underneath a button surface. A set of openings is formed in the frame base structure in alignment with respective contact portions of a respective at least one switch of the electrical control device such that, the actuating structure extends through the set of openings to contact a respective aligned switch contact of a respective the at least one switch in response to pressing a respective at least one button.

BRIEF DESCRIPTION OF THE DRAWINGS

The foregoing objects and advantages of the present invention may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION

Figure 1:
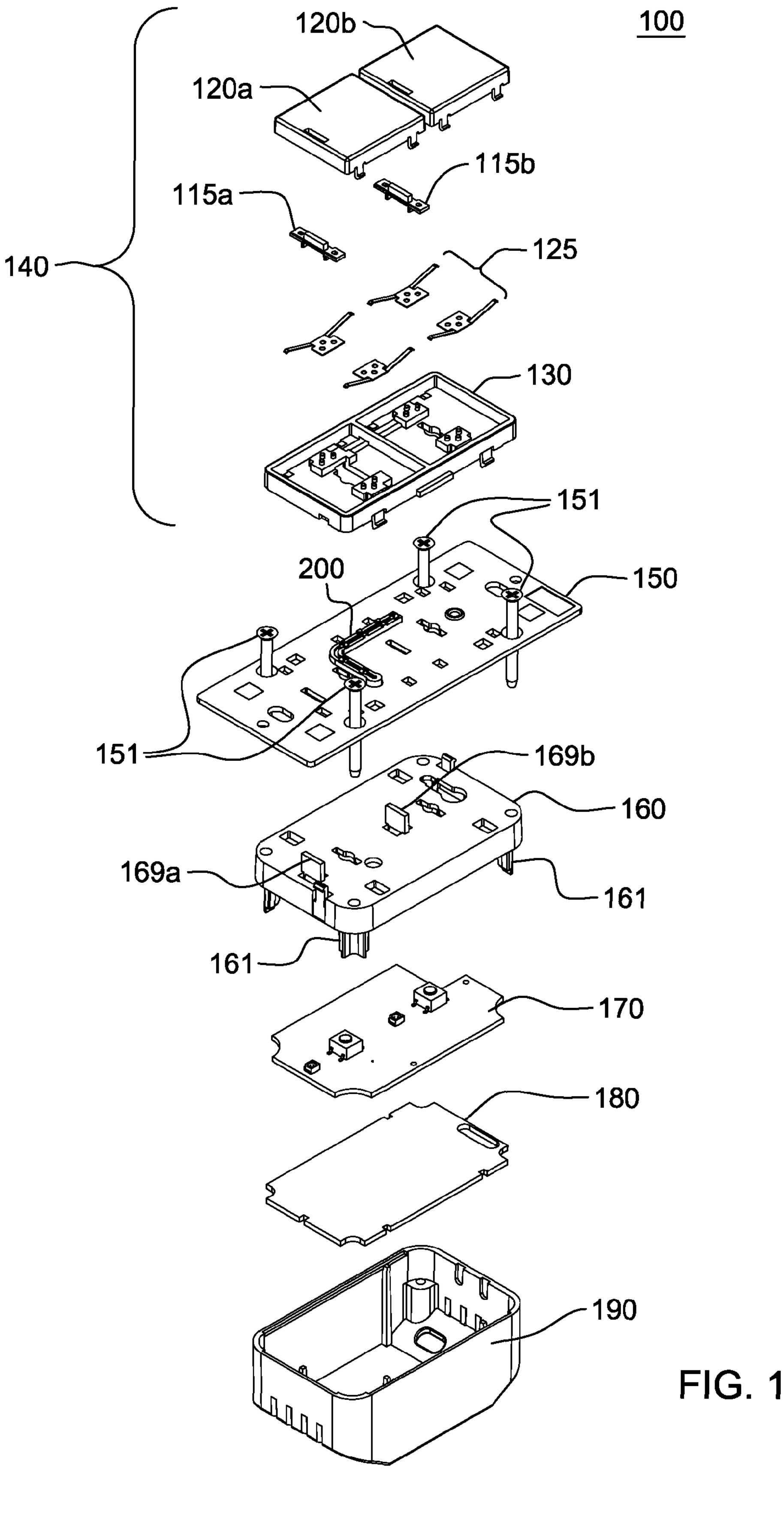
FIG. 1 illustrates an exploded perspective view of the dual load control device of an embodiment in accordance with the present invention.
Figure 9:
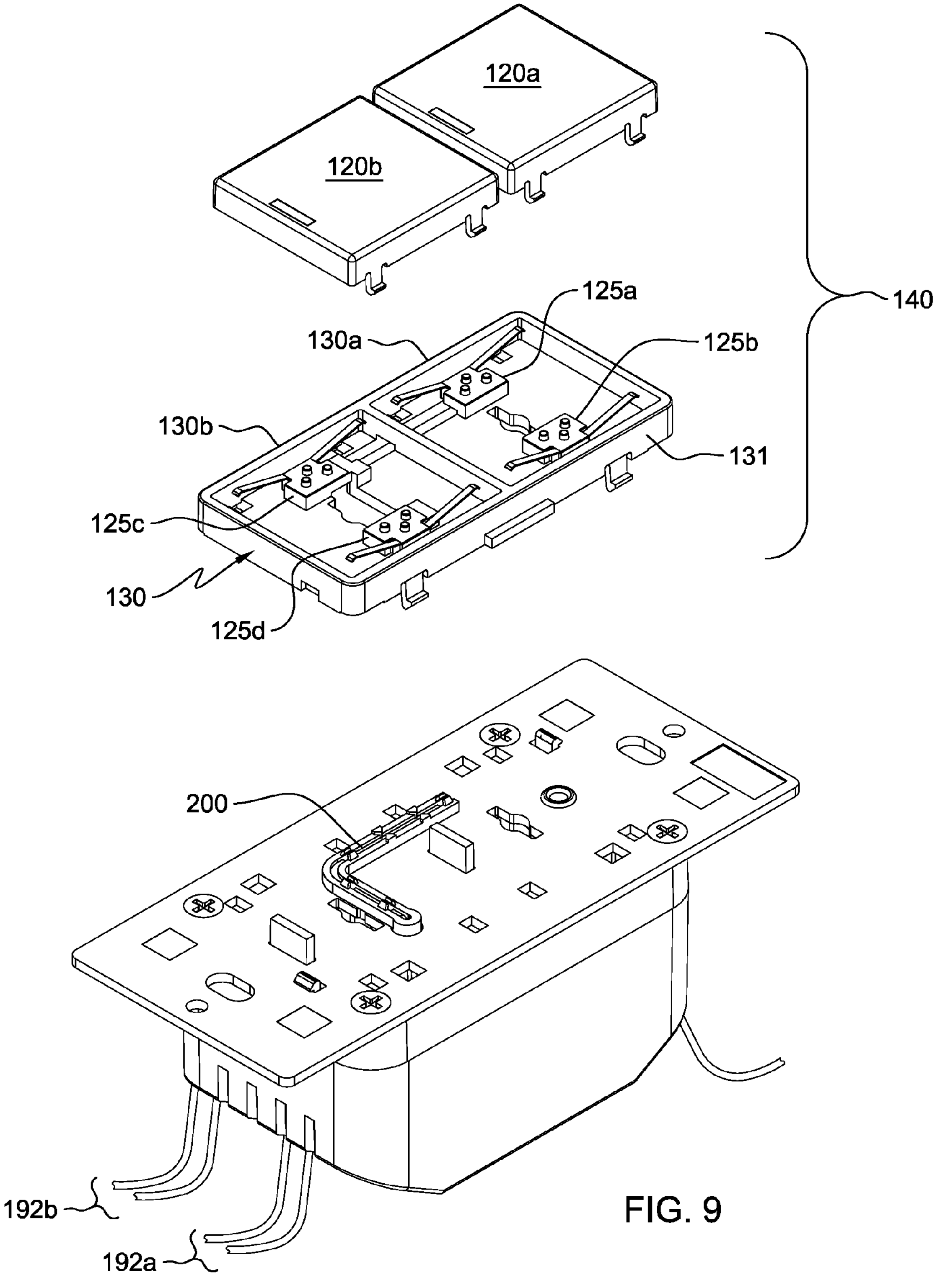
FIG. 9 illustrates a detailed exploded view of the button frame assembly 140 according to one embodiment of the invention.

FIG. 1 depicts an exploded perspective view of the dual load control switch device 100 according to an embodiment of the invention. Referring to FIG. 1, the dual load control switch device 100 includes a housing 190 in which one or more (Printed Circuit) PC boards including local load control switches, electronic control circuitry, light emitting source and light pipe elements and RF transceiver are housed. More particularly, disposed within housing is a first PC board 180 providing analog switches and related circuitry and wire connections (not shown) that extend outside of the housing for direct connection to an electrical load (e.g., an electrical outlet) for providing local switch control. The invention is described in an exemplary embodiment as providing local control of two (dual) electrical loads. This PC board 180 particularly includes circuitry responsive to signals generated in response to a respective push button actuation to provide, via direct wired connection, a local switch control, for example, to an electrical device which may be plugged into the electrical outlet (not shown). As shown in FIG. 9, to provide single-pole wiring of direct electrical connection of each respective switch provided at PC board circuitry 180 of the dual load control switch device to an electrical device or outlet (not shown), respective sets of conductive wires 192*a*, 192*b* including ground returns and/or neutral wires are provided.

It is intended that the present embodiment may control any suitable type of electrical load in addition to a load plugged into an electrical outlets such as but not limited to hardwired stationary loads such a light/fan fixtures, appliances and the like.

Further shown in FIG. 1 is a second PC board 170 providing digital control circuitry including switch processing control circuitry for controlling an RF transceiver and related circuitry that provide additional wireless controls via RF messaging for home or business automation. Although not shown in FIG. 1, it is understood that the circuit board 170 is provided or coupled to a power source (not shown) that feeds power into circuit board 170 for powering the light source and RE transceiver devices. The transceiver device, for example, employs both RF and digital circuitry and responds to remote control signals for effecting control of a device in accordance with a programmed instruction(s).

It is understood that, although two separate PC boards are shown in an example embodiment depicted in FIG. 1, the invention is not so limited as the digital and analog circuitry may be provided on additional PC boards and in other configurations.

Further shown in FIG. 1 is a rack assembly 160 supported within the housing 190 by legs 161 that mate with respective apertures formed at the corners of the housing cover. Rack assembly 160 is predominantly a translucent plastic assembly supporting a circuit board including a light source (a light emitting diode element such as a LED) and an embedded light pipe element for coupling light to the above-disposed frame assembly and push buttons. Rack assembly 160 is coupled to circuitry formed in underlying PCB 170 that is responsive to a button load control actuation for coupling light to a respective button of a top-mounted frame assembly 110.

Further shown in FIG. 1 is a metal plate or strap 150 disposed above the rack 160 and also secured to the underlying rack assembly 160 via screws 151 that are received by threaded screw holes formed at each corner of rack 160. When screwed into rack assembly 160, strap 150 covers support rack 160, and circuit boards 170 and 180 enclosing these elements in the housing. Shown disposed on a surface of strap 150 is an RF antenna 200, the configuration and detail of which is described in commonly-owned, co-pending U.S. patent application Ser. No. 11/559,646, the whole contents and disclosure of which is incorporated by reference as if fully set forth herein. In the construction of the antenna of the system, the antenna selected, which resides behind the button frame assembly, comprises a single wire antenna that is suitably loaded by the use of stripline-like components to produce a tuned, sensitive antenna for receiving and transmitting RF signals within the local area of the dual load control device. In one embodiment, the single wire antenna has a length that is less than a quarter of the transmitted or received wavelength. The antenna is compact and concealed for receiving and transmitting RF control signals for controlling devices such as, for example a light dimming system for turning on and off a light or dimming a light to a certain level in response to an external RF signal.

Disposed above and engageably mounted to the surface of strap 150 is a button frame assembly 140 of the dual load control switch device of the invention. The button frame assembly 140, shown in one embodiment, in perspective exploded view of FIG. 1, includes two wide area buttons 120*a*, 120*b*, each supported by two of four metal leaf spring devices 125 in the manner as described in greater detail herein, for enabling push button actuation. The metal leaf spring devices are disposed in a spaced-apart configuration and affixed to button frame bottom 130 in a manner such as not to electrically interfere with the single RF wire antenna disposed on the strap surface. Each respective button 120*a*, 120*b* includes an opening for receiving a respective lens element 115*a*, 115*b* mounted underneath the button surface such that a surface of the lens is co-planar with the surface of a button, and, as will be explained in greater detail herein below, indexed to directly receive light from a respective light pipe element 110*a*, 110*b* extending from the rack assembly 160 through the strap 150 and bottom of the button frame bottom 130, thereby obviating the need to provide a light pipe element in the button itself. That is, in response to switch actuation by depressing a button, light is coupled to the respective lens element of the button via the light pipe of rack assembly 160 and emanates from the top surface of the button.

Figure 2:
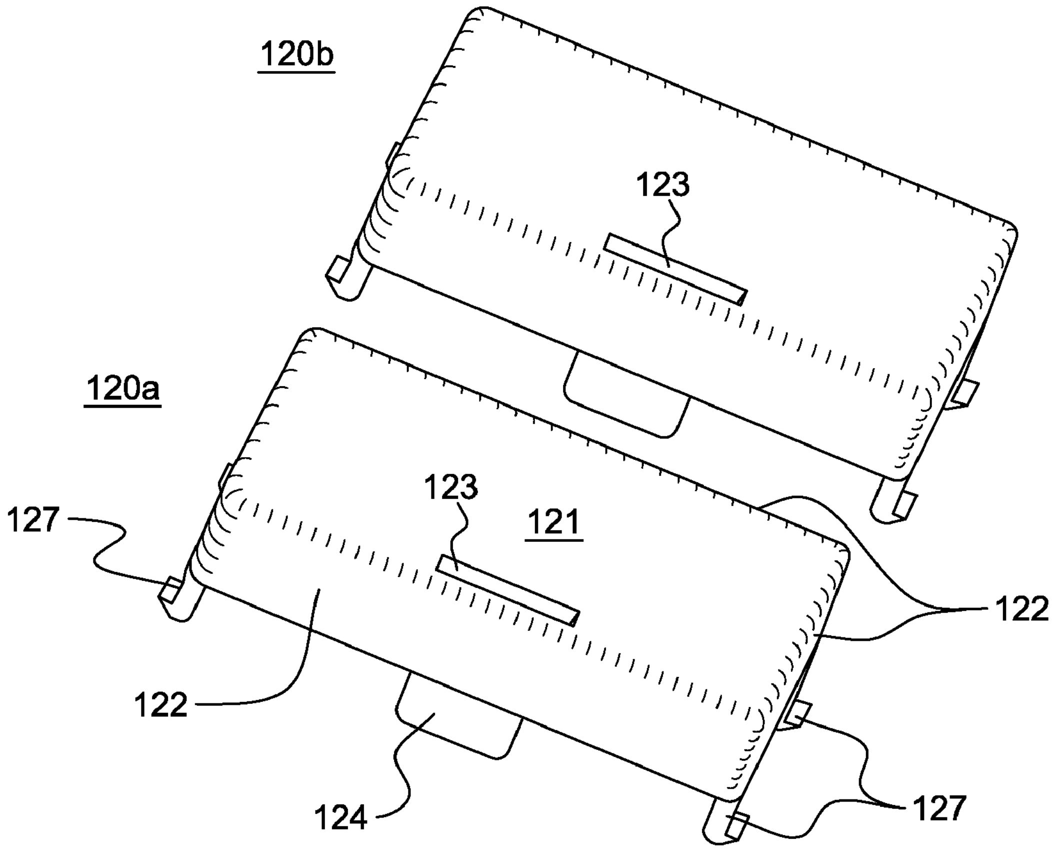
FIG. 2 illustrates perspective views of each wide-area button 120*a*, 120*b* of the dual load control device of an embodiment in accordance with the present invention.
Figure 4:
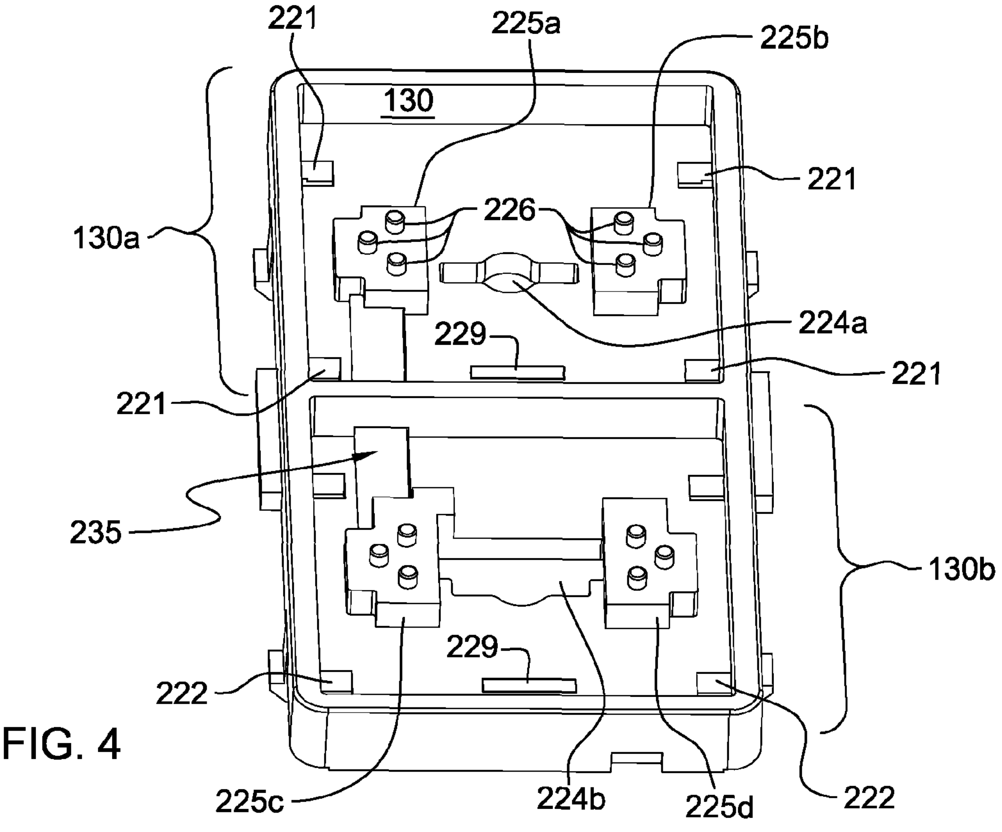
FIG. 4 illustrates an exposed perspective view of the inside surface of the button frame assembly bottom portion 130 of the dual load control device of an embodiment in accordance with the present invention.

FIG. 2 illustrates perspective views of each button 120*a*, 120*b* of the dual load control switch device 100 shown in FIG. 1. Each button, in the embodiment depicted in FIG. 4, is a push button device designed for movement in a singular direction. Each push button is of unitary plastic construction in the shape of a square or rectangle in the embodiment shown, however, is not limited to any particular geometric configuration. Each push button 120 includes a top surface 121 and side surfaces 122 and is adapted for mounting on leaf spring mechanisms situated on the button frame bottom 130 in the manner so as to provide a wide press area for a user. As shown in FIG. 2 and the side view of button 120 illustrated in FIG. 2A, each side surface 122 includes a respective downward extending leg 127, disposed at or proximate a respective corner of the button, including, at a distal end, an outward extending portion or foot 129 for engaging a respective catch formed in a respective opening at the bottom of button frame assembly 130 when the button is biased by said leaf springs. As further shown in FIG. 2, respective slots 123 are provided at the surface of each button that are aligned with a light source to display light via the button surface in the manner as explained in greater detail herein below.

It is understood that a rocker type button may be employed as well for contacting a switch actuator element provided on an underlying circuit board.

Figure 2A:
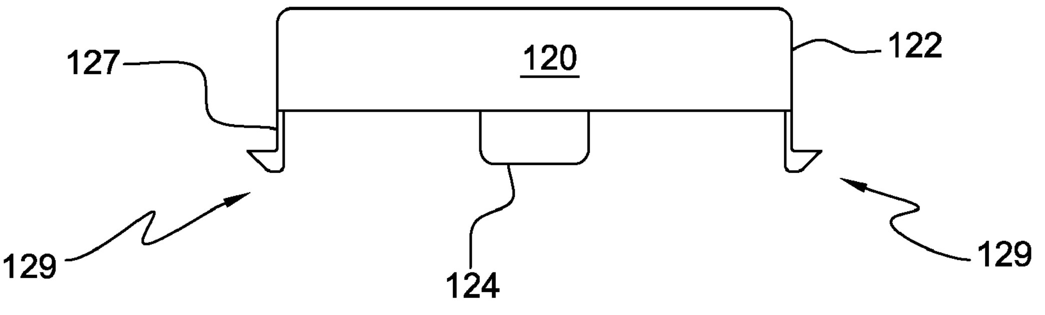
FIG. 2A illustrates a plan view of a wide-area button 120*a* of the dual load control device of an embodiment in accordance with the present invention.

As further shown in FIGS. 2 and 2A, underside each button top surface and situated approximately between each opposing edges is a downwardly extending actuator structure 124, which, as will be described in greater detail, directly contacts a respective switch on the circuit board 170 when the button is pressed.

As described herein with respect to FIG. 1, facilitating a uniform tactile feeling for the user when depressing a button 120*a*, 120*b* anywhere on the button surface relative to the frame assembly bottom 130, is one or more leaf spring devices 125 fixedly mounted on an inside bottom surface of the button frame assembly portion 130 having arms that support a respective button. In one embodiment, two leaf spring devices 125 are disposed within a frame assembly bottom portion for supporting an individual button at opposite ends thereof. In a preferred embodiment, the leaf spring devices each comprise a unitary metal structure.

Figure 3:
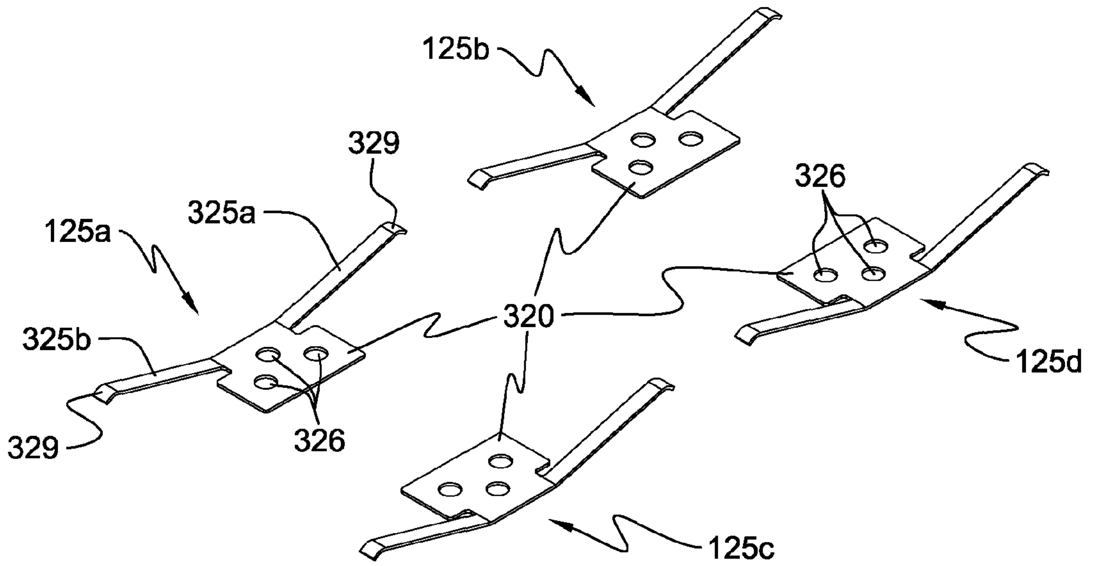
FIG. 3 illustrates a detailed perspective view of the metal leaf spring devices 125 that support buttons in button frame assembly bottom portion 13 0 of the dual load control device of an embodiment in accordance with the present invention.

More particularly, FIG. 3 depicts a detailed perspective view of the metal leaf spring devices 125 that support buttons 120*a*, 120*b* in button frame assembly bottom portion 130 shown in FIG. 1. Referring to FIG. 3, each metal leaf spring, such as leaf spring 125*a*, is a thin metal structure of unitary construction having a thin and flat platform portion 320 for mounting the metal leaf spring, and, along one edge 226 of the platform, a pair of metallic leaf arms 325*a*, 325*b* extending outward and upward in opposing directions at an angle with respect to the platform mounting portion 320. As shown in FIG. 3, the distal end of each metal leaf arm 325*a*, 325*b* provides a respective contact surface 329 underneath a button surface to provide biasing action for the push button when assembled in the frame.

As shown in FIG. 4 depicting an exposed perspective view of the inside surface of the button frame assembly bottom 1307 and FIG. 9 illustrating a detailed exploded view of the button frame assembly 140, two metal leaf spring devices 125*a*, 125*b* are fixedly mountable on respective raised ledges or plastic support structures 225*a*, 225*b* for supporting a single button, e.g., button 120*a*, in a button frame assembly bottom portion 130*a*, and, likewise, remaining two metal leaf spring devices 125*c*, 125*d* are fixedly mountable on respective raised ledges or plastic support structures 225*c*, 225*d* for supporting a single button, e.g., button 120*b*, in a button frame assembly bottom portion 130*b*.

Referring to FIGS. 3 and 4, in one embodiment, each thin and flat platform portion 320 of each metal leaf spring device 125*a*-125*d* is provided with one or more holes 326 that mate with respective plastic molded formations 226 that protrude from the surface of each respective plastic support structure 225*a*-225*d*. During assembly, the one or more holes 326 of thin and flat platform portion 320 of a metal leaf spring device 125*a* are mated with respective plastic molded formations 226, and the plastic molded formations 226 are subject to heat staking application sufficient for molding the plastic in a manner to securely affix the metal leaf spring 125 to the respective plastic support structure 225 within the frame bottom to result in the button frame assembly 140 shown in FIG. 9. It should be understood that thin and flat platform portions 320 of each metal leaf spring device 125*a*-125*d* may be fixedly mounted to each respective plastic support structure 225*a*-225*d* via alternative means besides heat application, e.g., epoxy, screws, etc.

In the button frame assembly of FIGS. 4 and 9, plastic support structure 225*a*-225*b* and 225*c*-225*d* are spaced apart such that, when fixed on a respective support structure described herein, the opposing outwardly extending metal leaf arms 325*a*, 325*b* of respective two mounted leaf spring devices 125*a*, 125*b* are located adjacent two opposing side surfaces 131 of the button frame assembly bottom. The length of each leaf spring device 125*a*, 125*b* is such that the respective supporting contact surfaces 329 provides support of each wide-area button at or near each inside corner underneath the push button. The push button support provided by the metal leaf arms 325*a*, 325*b* of the two mounted leaf spring devices 125*a*, 125*b* in the manner as depicted in FIG. 9, provides a uniform spring action and good tactile feel for a user when any part of the button surface is pressed.

Further, advantageously, the design of the metal leaf springs 125*a*-125*d* is such that the metal material does not provide significant interference with the RF antenna situated on the strap underneath the button frame assembly 140.

Referring back to FIG. 4, there is shown a first set of openings 221 formed in the bottom of button frame assembly bottom portion 130*a* for accommodating placement of each leg 127 and foot structure 129 of a corresponding button. The four legs of each push button 120*a* are resilient and may be snap-fit into openings 221 of the frame assembly bottom over the metal leaf springs 125*a*, 125*b*. Likewise, there is provided a second set of like openings 222 formed in the bottom of button frame assembly bottom portion 130*b* for accommodating placement of each leg 127 and foot structure 129 of a corresponding button for snap-fitting the push button 120*b* into the frame assembly bottom over the metal leaf springs 125*c*, 125*d*. The metal leaf spring devices 125*a*-125*d* bias each push button 120*a*, 120*b* in an upward direction relative to the button frame assembly bottom such that the button foot structure 129 engages a corresponding catch mechanism formed in the corresponding opening 221 in the bottom of button frame assembly bottom portion 130*a*. When the push-button is pressed, each leg's foot structure 129 extends below the opening of button frame assembly bottom portion 130*a* and into a corresponding opening formed in the underlying strap 150.

It should be understood that use of a same common leaf spring at multiple places (e.g., four (4) locations shown in FIG. 9) enables further cost reductions with respect to manufacture and assembly.

As further shown in FIG. 4, each button frame assembly bottom portion 130*a*, 130*b* is provided with a respective opening 224*a*, 224*b* aligned with downward extending actuator structure 124 of a respective button 120*a*, 120*b* to accommodate the downward movement of button when pressed by a user. Each downwardly extending structure 124 of respective push buttons 120*a*, 120*b* is dimensioned such that, when the push button is pressed, structure 124 directly contacts and actuates a switch control device provided on the underlying circuit board 170 situated in the rack 160. To facilitate this, corresponding aligned openings 154_a_, 154_b_ are provided in the strap 150, as shown in the detailed perspective view of strap 150 in FIG. 10, for accommodating movement of downwardly extending structure 124 when a button is pressed. Likewise, as shown in the detailed perspective view of rack 160 in FIG. 5, respective aligned openings 164_a_, 164_b_ formed on a top surface of the underlying rack assembly 160 are provided for accommodating downward movement of extending structure 124 of respective buttons 120_a_, 120_b_ to physically contact a respective dual load control switch device provided in the rack 160 when the button is pressed.

Returning to FIG. 4, the bottom frame assembly bottom 130 further includes a slot opening or channel portion 235 shaped for accommodating the corresponding RF antenna 200 and antenna holder 201 situated on the strap 150 when the button frame assembly 140 is mounted on the strap 150. As shown in the embodiment depicted, underside of the frame assembly the accommodating channel portion 135 is L-shaped to conform with the L-shaped RF antenna 200 formed on the strap.

Returning to FIG. 5, there is illustrated a detailed perspective view of rack 160 of the dual load control device of the present invention. In the embodiment depicted in FIG. 6, rack assembly 160 comprises a translucent body 166 in which is housed a printed circuit board 170 including respective switch devices corresponding to respective push buttons 120_a_, 120_b_.

Figure 6:
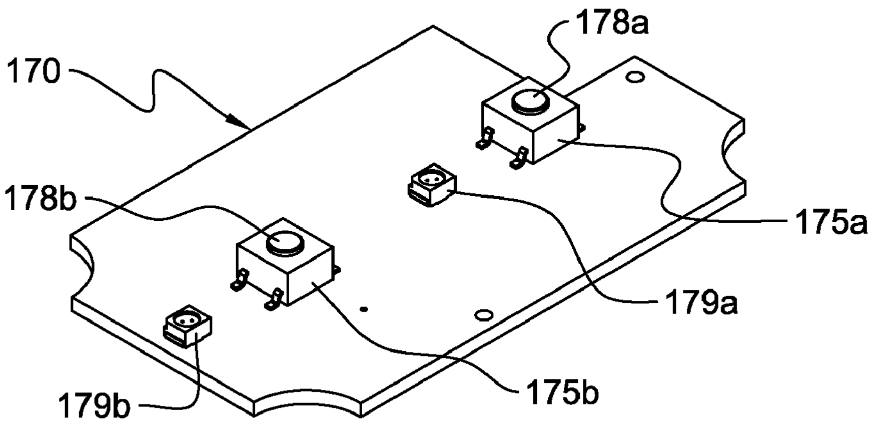
FIG. 6 illustrates in greater detail composition of the printed circuit board 170 of the dual load control device of an embodiment in accordance with the present invention.

FIG. 6 illustrates in greater detail the printed circuit board 170. As shown in FIG. 6, PC board 170 includes switch devices 175_a_, 175_b_ corresponding to respective buttons 120_a_, 120_b_. In one embodiment, switches 175_a_, 175_b_ are TAC switches, however, any suitable switch device may be implemented. These switches are electrically coupled to control circuitry and other components on PC board and have a switch body and respective actuator elements 178_a_, 178_b_. In operation, actuator elements 178_a_, 178_b_ are contacted by respective actuator element 124 formed underside respective push-button, when the push-button is pressed for local device control. In response to switch device actuation, an electrical signal is sent to circuit board 180 to perform a switching action (e.g., on or off) of a directly connected electrical load. PC board 180 particularly includes analog circuitry responsive to signals generated in response to a respective push button actuation to provide, via direct wired connection using conductive wires local switch control, for example, of an electrical device which may be plugged into the electrical outlet (not shown).

In a further embodiment of the invention, when configured for operation in an automation network, actuator elements 178_a_, 178_b_, when contacted by respective actuator element 124 formed underside respective push-button in response to the push-button being pressed, will send an electrical signal to activate a set of programmed instructions to effect generation of wireless RF remote control functionality associated with the respective switch.

As further shown in FIG. 6, associated with each switch 175_a_, 175_b_ is a respective light source such as a light emitting diode (LED) 179_a_, 179_b_ that emits light up through a light pipe formed on the rack assembly 160. Switch elements 175_a_, 175_b_ are electrically coupled with circuitry for initiating light emission from a respective LED 179_a_, 179_b_ when a button is pressed or, to thereby indicate a status of the respective switch. Thus, in a further embodiment of the invention, whether configured for operation in an automation network, or, for control of a directly connected electrical load, contact of switch actuator elements 178_a_, 178_b_ of switches 175_a_, 175_b_ by respective actuator element 124 formed underside respective push-button in response to the push-button being pressed, will cause generation of light from the respective associated LED 179_a_, 179_b_.

Returning to FIG. 5, the rack assembly 160 includes embedded light pipe elements 169_a_, 169_b_ that extend from the surface of the rack assembly 160 and that are aligned with respective light emitting elements (e.g., LEDs) 179_a_, 179_b_ of the circuit board supported therein. The light pipe elements 169_a_, 169_b_ are formed of a translucent plastic material and are shown as protruding upward from the surface of rack assembly 160. In operation, in response to a respective switch 175_a_, 175_b_ actuation, the light intensity that is emitted from respective LED 179_a_, 179_b_ is carried directly through respective light pipe element 169_a_, 169_b_ to a respective button. As shown in the perspective view of strap 150 in FIG. 10 and in the detailed semi-assembled perspective view of FIG. 11, apertures 159_a_, 159_b_ are provided in the strap to permit respective light pipe element 169_a_, 169_b_ to protrude therethrough. Likewise, as shown in FIG. 4, the button frame assembly bottom 130 includes aligned slots 229 that are also provided to permit respective light pipe element 169_a_, 169_b_ to protrude therethrough. Thus, when the dual load control device is fully assembled and the button frame assembly 140 is snap-fit to the strap 150, respective slots 123 provided at the surface of the button are aligned with the protruding light pipe element to receive the light from the light pipe element 169_a_, 169_b_ protruding from the rack 160 via the strap and frame assembly bottom and display the light via the button surface.

Figure 7:
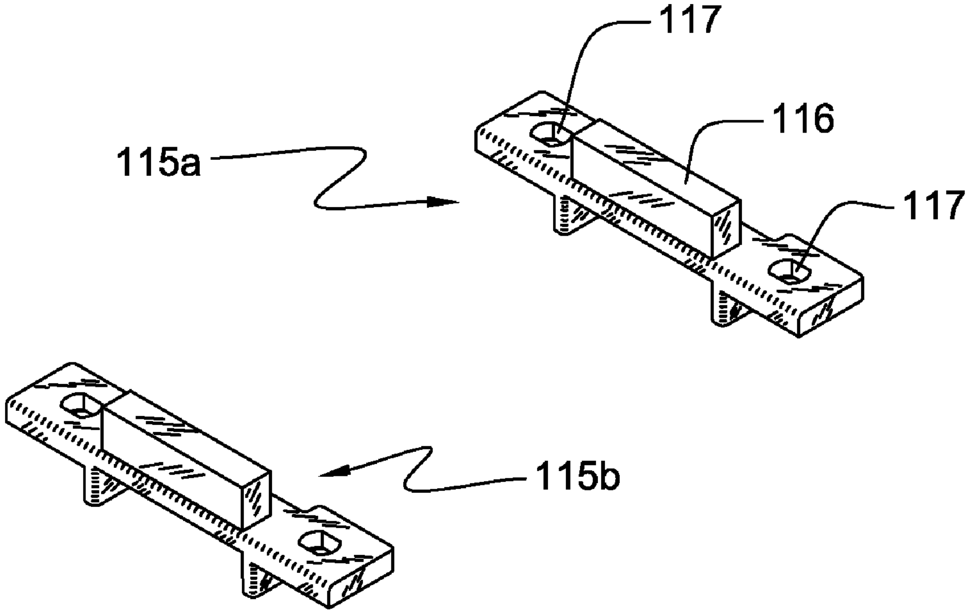
FIG. 7 illustrates respective translucent lens elements provided in the respective buttons of the dual load control device of an embodiment in accordance with the present invention.
Figure 8:
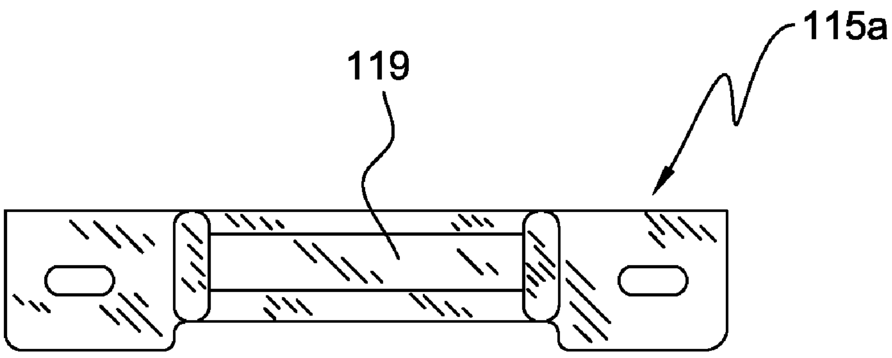
FIG. 8 is a bottom plan view taken along line A-A of FIG. 7 illustrating the underside of a lens element according to one embodiment of the invention.
Figure 11:
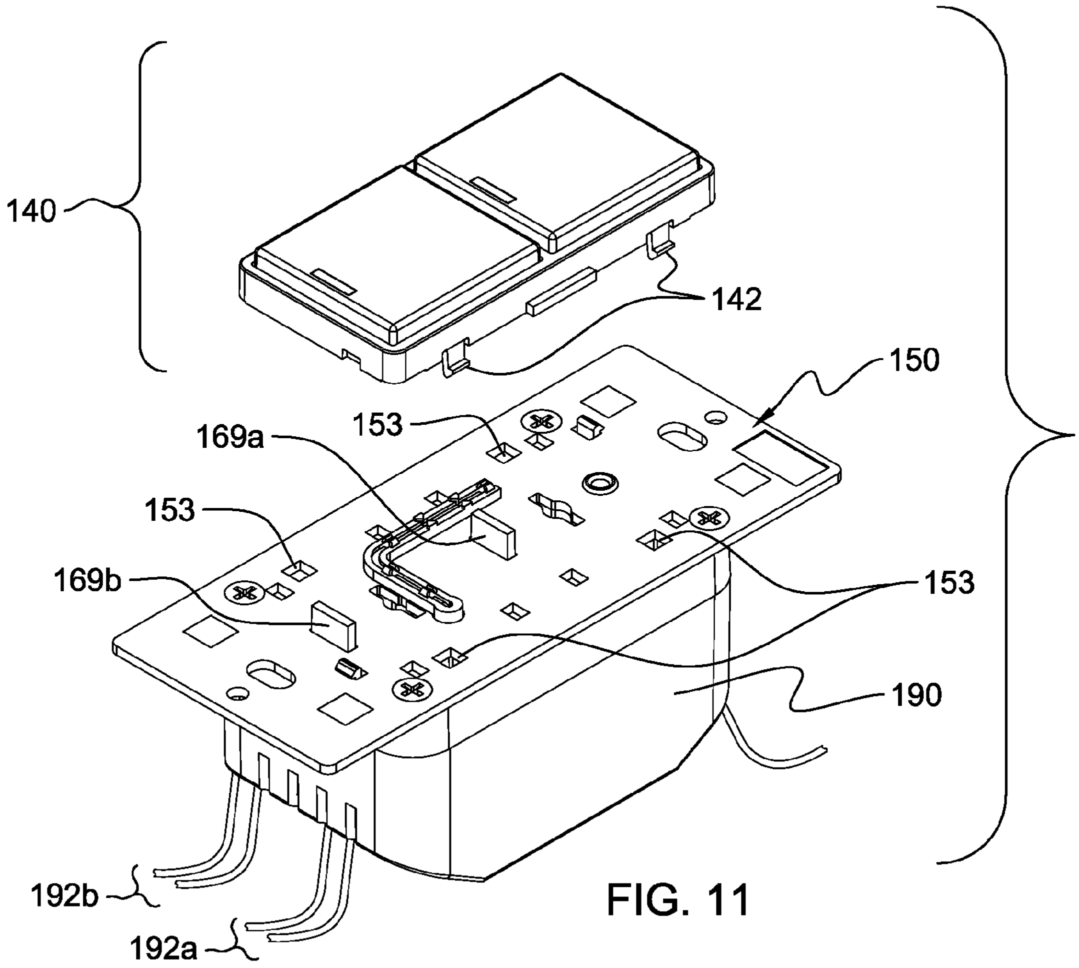
FIG. 11 shows a perspective exploded view of a semi-assembled device wherein strap 150 is coupled to housing 190 of the dual load control device of an embodiment in accordance with the present invention; and, FIG. 12 illustrates a block diagram of the control circuitry provided on circuit board 170, 180 for dual load control device of an embodiment in accordance with the present invention.

In one embodiment, as shown in FIG. 7, the underside of each button may include a respective translucent lens element such as the lens element 115_a_, 115_b_ that are mounted directly in alignment with a respective slot 123 underneath the button such that a lens element surface 116 is co-planar with the surface of the button to ensure a seamless and smooth button surface. In one non-limiting embodiment, each lens element 115_a_, 115_b_ is mounted to the underside of the button via heat staking application to plastic formations (not shown) aligned with weld holes 117, however, they could be mounted by epoxy or other affixation means. As shown in FIG. 8 depicting a bottom plan view of an underside of each lens element 115_a_, 115_b_ taken along line A-A shown in FIG. 7, lens element 115 provides a receptacle 119 designed to directly receive a top portion of a respective protruding light pipe 169_a_, 169_b_ when the button frame assembly is snap-fit to the surface of the strap 150 attached to the top of rack 160 (FIG. 11). Thus, in response to switch actuation by pressing a push-button, light is directly communicated to the button via a light pipe element received by the lens element formed underside.

Thus, advantageously, the button frame assembly and metal leaf spring design obviates the need for plastic spring biasing mechanisms and lightpipe receiving buttons thereby reducing the cost of manufacturing.

Figure 5:
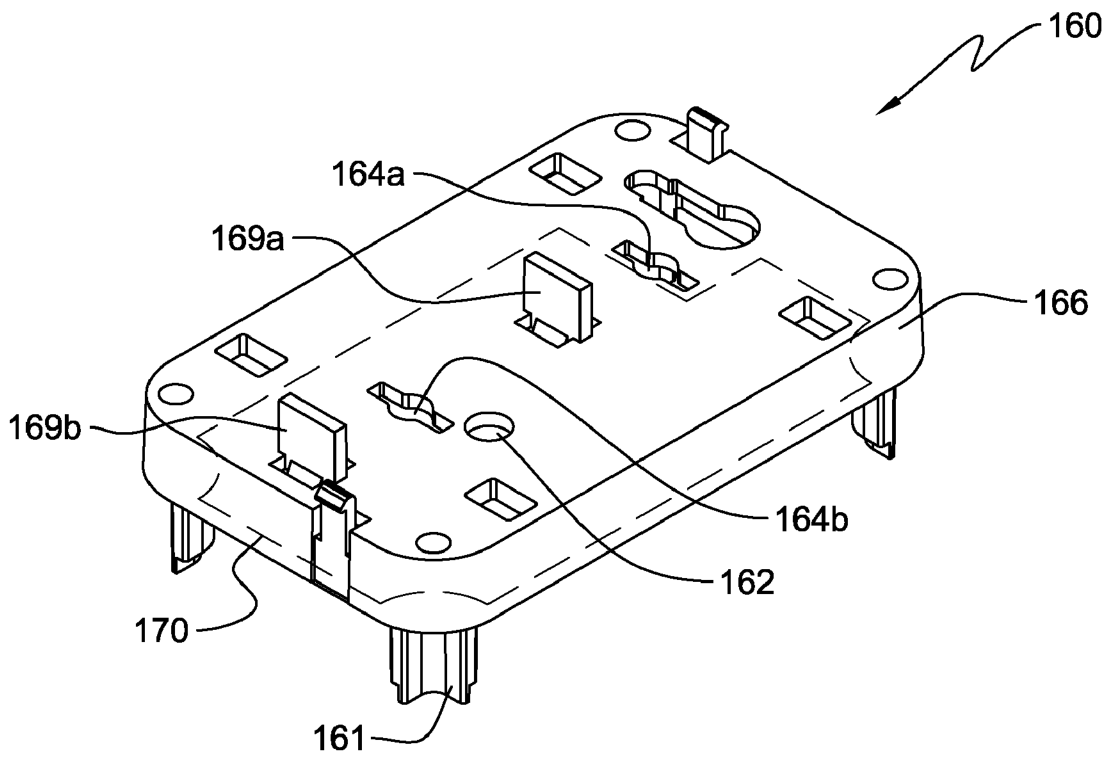
FIG. 5 illustrates a detailed perspective view of rack 160 of the dual load control device of an embodiment in accordance with the present invention.
Figure 10:
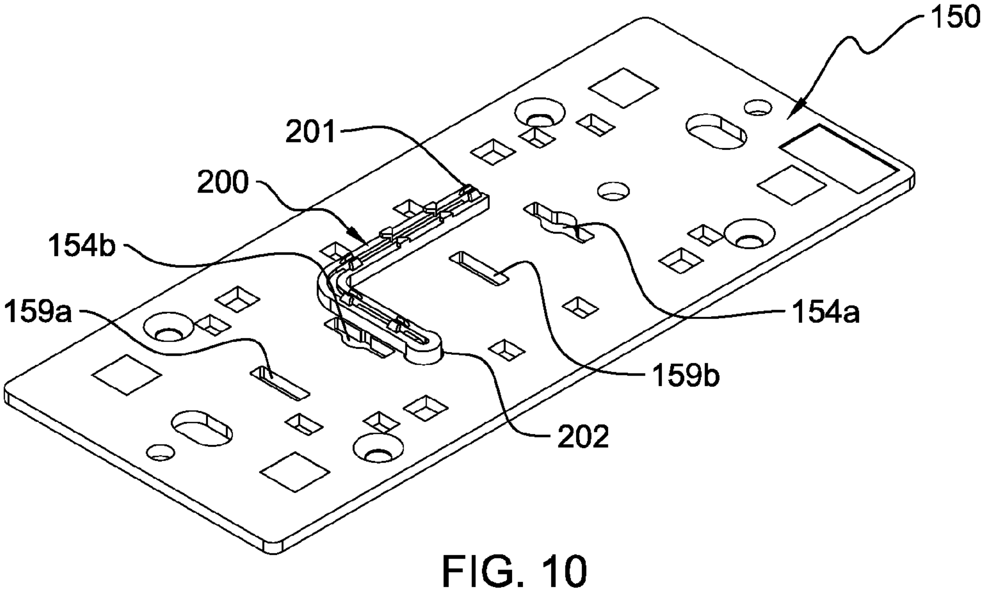
FIG. 10 illustrates a detailed perspective view of strap 150 of the dual load control device of an embodiment in accordance with the present invention.

Referring to FIG. 10, there is depicted a perspective view of the support strap assembly 150 upon which, in one embodiment, is coupled an antenna holder 201 and coupled thereto the antenna 200, on the outside surface. Antenna holder 201 is preferably an insulator material that can be snapped in to strap 150 thereby shielding antenna 100 from unnecessary electrical interference with strap 150. Antenna 200 is coupled to circuit board 170 in a manner such that the antenna itself is fed from the circuit board up through the translucent body 166 via an eyelet or opening 162 provided on the surface of the rack 160 (as shown in FIG. 5), and aligned opening 202 provided in the strap (as shown in FIG. 10) to antenna holder 201. In the embodiment of the antenna as described in commonly-owned, co-pending U.S. patent application Ser. No. 11/559,646, the antenna does not receive any power-line AC frequencies or DC; instead it is capacitively coupled to the electrical components of a control circuit part of circuit board 170. However, it is understood that the antenna may be directly coupled to a control circuit part in an alternate embodiment.

FIG. 11 shows a perspective exploded view of a semi-assembled device wherein strap 150 is coupled to housing 190 with antenna 200 and antenna holder 201 disposed beneath the button frame assembly 140. Frame 140 is fitted into strap 150 via a series of catches 142 which are resilient and adapted to snap-fit into associated holes 153 in strap 150. Frame 140 can be removed from strap 150 by simply pressing laterally in a forceful manner to unclip catches 142. Thus, button frame assembly 140 is interchangeable and different colored button frame assemblies can be attached to the strap 150 as the user desires.

The dual load control device as described herein may be employed, in a first operating mode, for direct wired control of an electrical device, in response to pressing wide-area push buttons (i.e., each button on the dual load control device will control the attached local load non-wirelessly). Alternately, the dual load control device may be employed, in a second operating mode, for use in wireless applications, e.g., a wireless lighting control system. In such an application, the dual load control device is programmed to generate and transmit wireless (RF) messages for controlling one or more electrical devices in response to pressing a push-button of the dual load control device, so as to enable load control of the directly connected electrical load and other remote loads (via wireless messaging). In this embodiment, the dual load control device may be programmed, via wireless command received from hand-held controller or any other similar installation device, so that same the button of dual load controller device can control the local load (as in the first operating mode) as well as at least one remote load wirelessly. In order to control a load wirelessly, prior programming steps are implemented for assigning an address of the remote load, and then associating the remote load device to a desired button on the dual load control device using wireless programming. In a third operating mode, the dual load controller functions only as a controller of remote electrical loads responsive to pressing a push-button of the dual load control device after the programmed steps of assigning an address of the remote load and then associating the remote load device to a desired button on the dual load control device. In another mode local load of dual load control device can also be wirelessly controlled from handheld remote or another wireless device in the installation. In a current implementation, a wireless RF based transmission protocol is implemented for control networks, business and home automation, but other wireless RF based transmission protocols may be employed. In such application, the compact and concealed antenna is connected to a lighting control system such as, for example a light dimming system for turning on and off a light or dimming a light to a certain level in response to an external RF signal. In the construction of the antenna of the system, the antenna selected, which resides behind the switch plate, has a length that is less than a quarter of the transmitted or received wavelength. The antenna comprises a single wire antenna that is suitably loaded by the use of stripline-like components to produce a tuned, sensitive antenna for receiving and transmitting RF signals within the local area of the dual load control devices.

Figure 12:
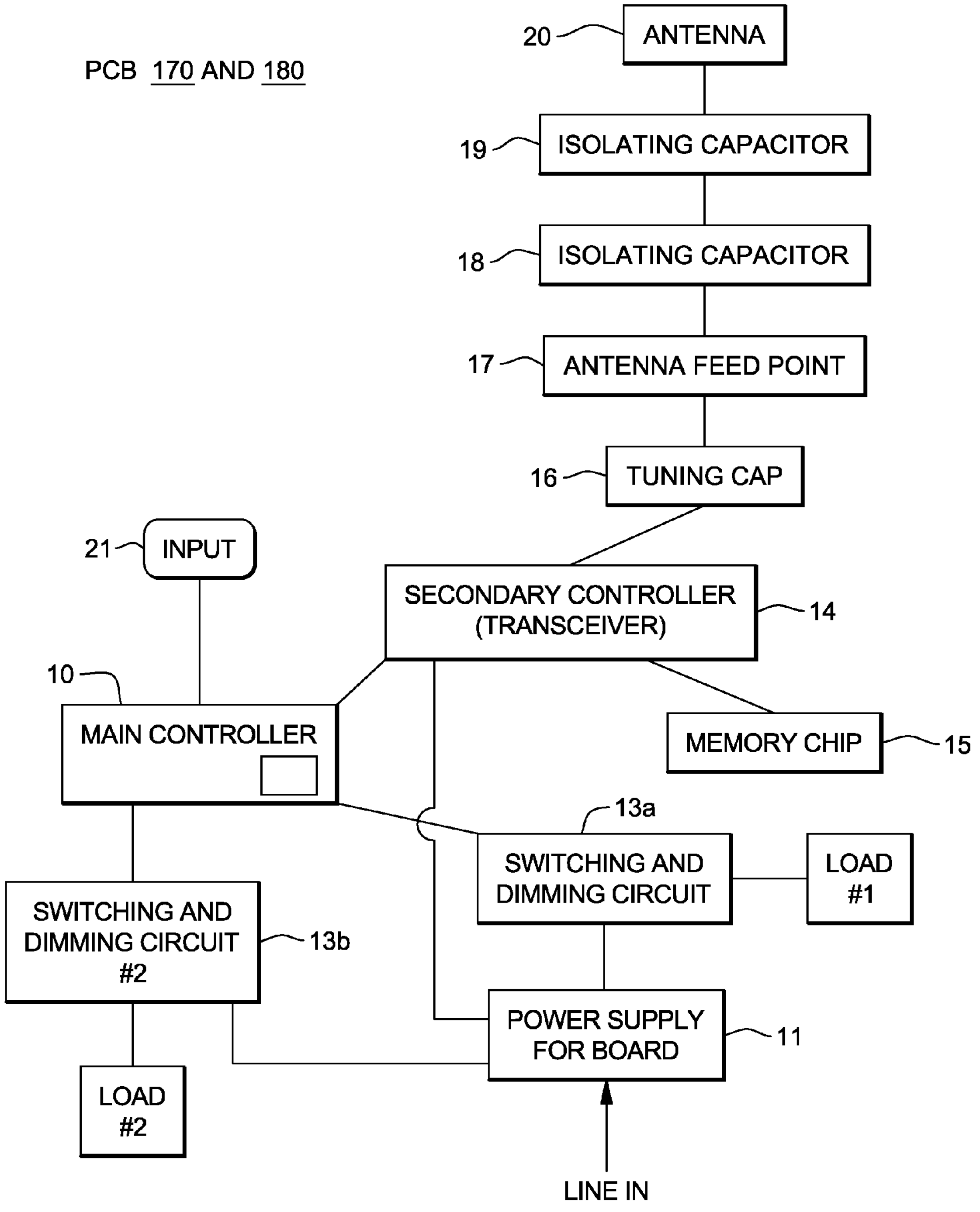

With respect to the aforementioned control circuitry provided on circuit board 170, FIG. 12 depicts a block diagram of a main controller 10, and a power supply 11, which in turn is connected to a main power source such as 110 volts AC. Main controller 10 may be any switching control circuit capable of handling the two electrical loads (e.g., lighting load) which is connected to it. The main controller 10 is provided with two outputs that each connects to a respective switching and dimming circuit 13*a*, 13*b* (for example a dimmer switch, and on/off switch etc), and to a secondary controller or transceiver 14. The antenna circuit comprises a tuning capacitor 16 coupled to an antenna feed point 17, which in a preferred embodiment is coupled to isolating capacitors 18 and 19, however, an antenna circuit in an alternative embodiment may include less than, or more than 2 isolating capacitors. These isolating capacitors are in turn connected to the actual antenna line 200. In an alternate embodiment, an air gap switch (not shown) which is a mechanical switch or relay that may be connected to the 110 volt AC line, may be provided to disconnect the power from the control circuitry when the two contacts of gap switch are physically separated, such as when the switch is exposed or opened up for inspection.

The main controller 10 controls the functions of the load. In particular, it can be used to control the amount of power using the switching and dimming circuits 13*a*, 13*b* directed to the first load #1 or second load #2 (for example a dimmer switch, and on/off switch etc). Main controller 10 can include a processor and works in communication with the communication controller and the memory chip.

Secondary controller or RF Transceiver 14 is used to control the wireless communication between antenna 200 and the other logic components such as main controller 10 and memory storage device, e.g., chip 15.

Memory storage device 15 is an EEPROM memory chip that can be in communication with secondary controller 14. This EEPROM is encoded with, and can be used to store the following characteristics: last load status, light level, minimum and maximum settings or other known settings. The memory storage device will also include a mapping or association of the address associated with a remote wireless electrical device in the wireless network to a button for remote wireless control applications either via the push button or, alternately, via a hand-held remote. In this case, the EEPROM also offers power down storage and retrieval of events status during power up. A power supply 11 is shown coupled directly to the controller and switching circuits, however, in an alternate embodiment, may be coupled between an air gap switch (not shown) and the controller. It should be understood that memory chip 15 can be any suitable type of memory chip such as but not limited to non-volatile random access memory (RAM), e.g., NVRAM, MRAM, battery-powered SRAM, DRAM, EPROM, ROM, Flash memory, and other types of read only memory.

It may be preferable to provide a pre-assembled color change kit (frame, faceplate and buttons of a designer color, for example, that a user can mount to a support plate in place of another), the embodiment of the button frame assembly described herein takes up less space than conventional load control switch devices (having less functional parts for assembly) and decreases waste of material when only one color frame kit is being used.

Although a few examples of the present invention have been shown and described, it would be appreciated by those skilled in the art that changes might be made in these embodiments without departing from the principles and spirit of the invention, the scope of which is defined in the claims and their equivalents.

What is claimed is:

1. An electrical control device comprising;

a single-gang electrical housing being at least partially mountable within an electrical wall box;

first and second switches disposed at least partially within said housing, each of said first and second switches configured as providing a respective first and second input to the electrical control device, the electrical control device being wired to a respective first and a second electrical load, wherein the first input controls the first electrical load and the second input controls the second electrical load;

a frame assembly supporting first and second actuators, each of said first and second actuators adapted to actuate said respective first and second switches; and, a communications device disposed at least partially within said housing and configured to wirelessly transmit and/or receive a control signal, wherein the communications device is adapted to control at least one of the first electrical load, the second electrical load, and a remote electrical load in accordance with the received control signal.

2. The electrical control device of claim 1, wherein one of the first or second inputs also controls the remote electrical load.

3. The electrical control device of claim 1, further including:

a circuit board disposed in said housing and including control circuitry to control said first and second electrical loads in response to said first and second inputs, wherein each of said first and second switches are disposed on said circuit board and are communicatively coupled to said control circuitry to provide said first and second respective inputs.

4. The electrical control device of claim 1, said frame assembly further comprising at least one leaf spring, said at least one leaf spring being adapted to bias at least one of said first and second actuators in a first direction.

5. The electrical control device of claim 1, wherein said frame assembly includes first and second leaf springs adapted to bias said respective first and second actuators, each of said first and second leaf springs comprising:

a platform mounting portion affixed to said frame assembly;

a pair of leaf arms extending outward and upward in opposing directions at an angle with respect to the platform mounting portion, each said leaf arm having an actuator contact surface at a distal end thereof.

6. The electrical control device as claimed in claim 5, wherein said platform includes an RF antenna mounted on a surface thereto and coupled to said communications device.

7. The electrical control device as claimed in claim 1, further comprising first and second light emitting devices associated with a respective said first and second switches, each said first and second light emitting devices to emit light indicative of the state of respective said first and second electrical loads.

8. A method for controlling a plurality of electrical loads using a single-gang electrical load control device, the method comprising:

actuating a first switch or a second switch using a respective first or second actuator supported by a housing of said load control device;

providing an input to the electrical load control device in response to said actuation of said first or second switch;

controlling a respective first and second electrical load electrically connected to said single-gang electrical load control device in response to said input; and, either (i) receiving a wireless control signal and controlling one or more of said first load, said second load and a remote electrical load, or (ii) transmitting a wireless control signal in response to said input to further wirelessly control a remote electrical load.

9. The method as claimed in claim 8, wherein said respective first and second electrical loads are respectively wired to said single-gang electrical load control device, said respective first and second wired electrical loads being controlled through the wires.

10. The method as claimed in claim 9, further comprising:

wirelessly controlling the remote electrical load by receiving wireless communication signals, and generating wireless control signals to control said remote electrical load.

11. The method as claimed in claim 8, further comprising:

providing first and second light emitting devices associated with a respective said first and second switches; and, emitting light indicative of the state of respective said first and second electrical loads.

12. An actuator frame assembly for an electrical control device, said electrical control device including a housing at least partially mountable within an electrical box, said electrical control device including a switch for controlling a wired electrical load, said actuator frame assembly comprising:

a frame base adapted to engage a front surface of said housing, said frame base including an actuator;

a leaf spring disposed on said frame base and configured to bias said actuator in a first direction, said actuator having an actuating arm extending from a bottom surface of said actuator;

a first opening formed in said frame base, said first opening disposed in alignment with said actuating arm and said switch of said electrical control device;

wherein said actuating arm is adapted to extend through said first openings to contact said switch upon actuation of said actuator.

13. The actuator frame assembly of claim 12, wherein said leaf spring comprises:

a leaf spring mounting portion for mounting on said frame base;

a plurality of leaf arms extending upward at an angle with respect to the leaf spring mounting portion and outward in opposing directions, each of said plurality of leaf arms having a respective contact surface at a distal end thereof to biasingly engage said actuator.

14. The actuator frame assembly of claim 13, wherein said actuator further comprises an actuator opening formed on a surface of said actuator and a light transmitting device/element disposed in said actuator opening and optically coupled to a light pipe associated with said electrical control device said light pipe being adapted to receive/channel light from a light source associated with the electrical control device, wherein said light source emits light indicative of the state of said electrical load, said actuator frame assembly further comprising:

a second opening formed in said frame base, said second opening to enable at least a portion of said light pipe to extend there through, wherein light from said light source is transmitted/channeled to said light transmitting device/element.

15. The actuator frame assembly as claimed in claim 13, wherein said leaf spring comprises two leaf springs, each of said leaf springs being mounted to said frame base at opposing sides thereof such that said contact surfaces of each of said plurality of leaf arms provide substantially uniform spring action for biasing said actuator.

16. The actuator frame assembly as claimed in claim 12, wherein said electrical control device further includes a communications device disposed at least partially within said housing to wirelessly control at least one of said wired electrical load and a remote electrical load.

17. The actuator frame assembly as claimed in claim 16, said housing front surface including an RF antenna mounted thereon and coupled to the communications device, said frame base further comprising: an antenna opening to accommodate said RF antenna.

18. An electrical control device comprising:

a single-gang housing including a line terminal for connection to a source of electricity and a plurality of load terminals adapted for connection to a respective plurality of electrical loads;

a plurality of switches electrically coupled between said line terminal and said plurality of respective load terminals, wherein each of said plurality of switches selectively electrically couple respective said plurality of electrical loads to said line terminal to provide electricity to said plurality of electrical loads;

first and second actuators supported by said single-gang housing, each of said first and second actuators adapted to actuate a respective switch of said plurality of switches;

a communications circuit adapted to transmit/receive wireless control signals; and a controller coupled to said communications circuit and to said plurality of switches, said controller being adapted to accept a local control signal and/or said wireless control signal, wherein said controller selectively controls said plurality of switches in response to said local control signal and/or said wireless control signal.

* * * * *